United States Patent [19]
Kreisinger

[11] Patent Number: 5,238,431
[45] Date of Patent: Aug. 24, 1993

[54] SELF SECURING ELECTRICAL CONTACT ASSEMBLY

[75] Inventor: Robert D. Kreisinger, Plantation, Fla.

[73] Assignee: Motorola, Inc., Schaumburg, Ill.

[21] Appl. No.: 842,312

[22] Filed: Feb. 24, 1992

[51] Int. Cl.$^5$ .............................................. H01R 13/40
[52] U.S. Cl. ........................................ 439/733; 429/123; 439/504
[58] Field of Search .............. 439/77, 493, 495, 499, 439/502, 504, 733; 429/123

[56] References Cited

U.S. PATENT DOCUMENTS 4,714,439 12/1987 Marabotto et al. ............. 429/123 X
5,006,073 2/1990 Menona, Jr. ........................ 439/77

Primary Examiner—Eugene F. Desmond
Attorney, Agent, or Firm—Pablo Meles; Lesley Ann Rhyne

[57] ABSTRACT

An electrical contact assembly (10) for insertion into an aperture (14) in a housing (12) having an exterior and an interior surface comprises a flexible circuit (20) having a tongue portion (23) and a conductor (25) on at least the tongue portion, a member (26) having an external contact (28) which is coupled to the conductor (25), wherein the member is inserted through the aperture (14) through the interior surface and covers portions of the aperture and the exterior surface.

7 Claims, 2 Drawing Sheets

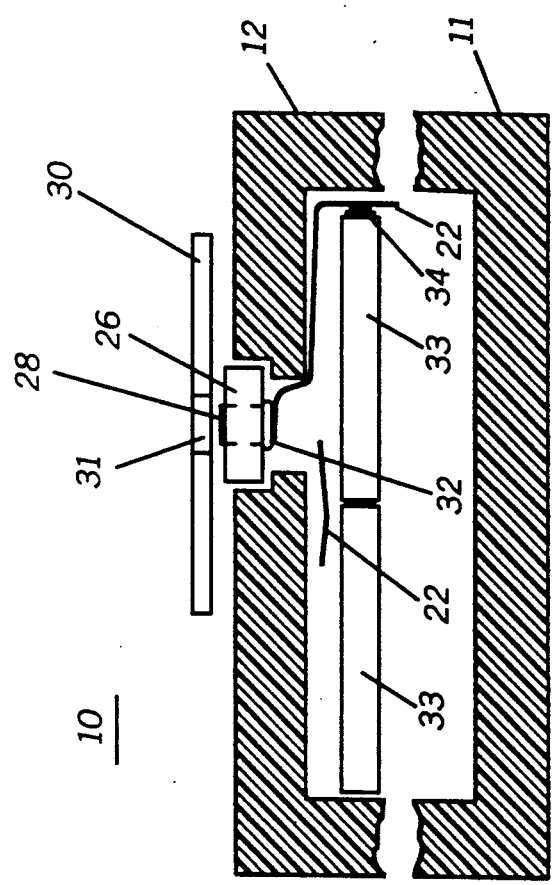

SELF SECURING ELECTRICAL CONTACT ASSEMBLY

TECHNICAL FIELD

This invention relates generally to contact assemblies, and more in particularly to a self securing contact assembly requiring minimal labor to assemble.

BACKGROUND

Mounting electrical contacts to a housing wall is often desirable. For example, in a portable two-way radio having a battery pack which has both charger contacts and contacts for connection to the radio, various approaches are used for mounting the contacts such as riveting, ultrasonic welding, soldering, mechanical clinching, or other means for securing. These methods of securing are labor intensive and cause variations in contact depth. Variation in contact depth, for example, causes inappropriate connections between the charger contacts on the battery and the contacts on the charger. It is also necessary to connect the contacts to the circuitry on the inside of the housing. One known approach uses rivets which are affixed to a flex circuit. Rivets, however, do not produce highly reliable electrical connections to flex circuits and require ultrasonic welding or heat staking of the contact carrier the housing wall. Thus, a need exists for a contact assembly that could be surface mounted to a flex circuit and easily assembled and secured on a housing wall.

SUMMARY OF THE INVENTION

An electrical contact assembly for insertion into a housing opening comprises a flexible circuit having a tongue portion and at least a conductor on the tongue portion, a member coupled to the tongue having a contact coupled to the conductor, and a housing having an aperture for insertion of the member through the aperture.

BRIEF DESCRIPTION OF THE DRAWINGS

FIG. 4 is a side view of a battery in accordance with the present invention.

DETAILED DESCRIPTION OF THE PREFERRED EMBODIMENT

Figure 1:
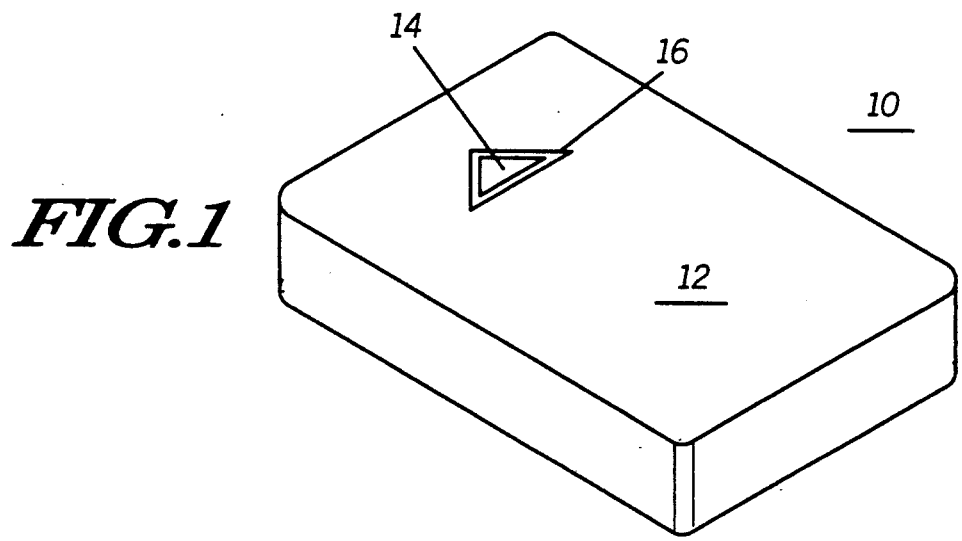
FIG. 1 is perspective view of a housing having an aperture in accordance with the present invention.

Referring to FIG. 1 there is shown a housing 12 of a battery 10 having an aperture 14 in accordance with the present invention. Preferably, the aperture 14 or hole in the housing 12 includes a counter sunk ridge 16 wherein a member 26 shown in FIG. 2 could fit and be self-aligned into the aperture and thereby covering the aperture 14.

Figure 2:
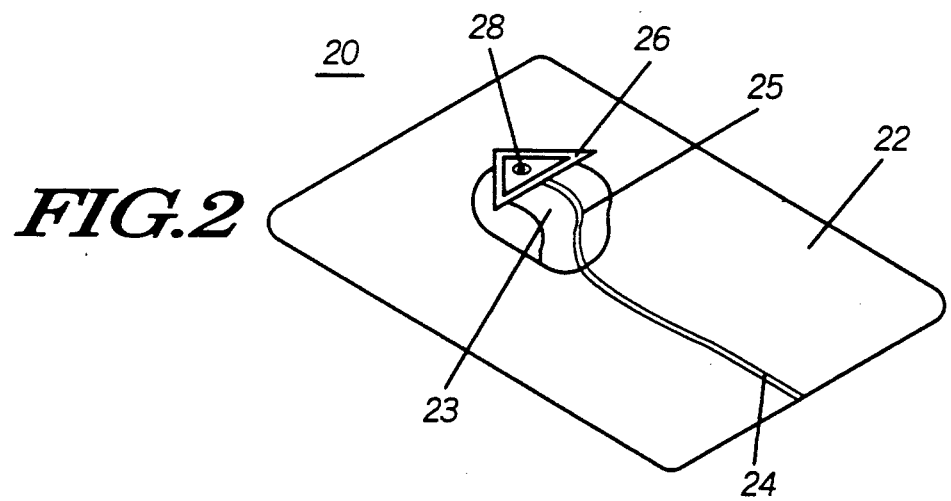
FIG. 2 is a perspective view of a flexible circuit and member in accordance with the present invention.

Referring to FIG. 2, there is shown a flexible circuit 20 having a flexible substrate 22 and at least one conductor 24. The flexible circuit 20 further includes a tongue portion 23 which also preferably carries a portion 25 of the conductor 24. The tongue portion 23 further carries a member, preferably substantially the shape of the aperture 14 or the counter sunk ridge 16, although other shapes are within contemplation of the present invention. The shape of member 26 can be any shape that would allow passage of the member 26 through the aperture 14 in some orientation. It is also within contemplation of the present invention that the size and shape of the aperture as well as the size and shape of the member can be any size and shape that will allow the placement of the member on the exterior surface of the housing. Preferably the member 26 includes a contact 28 which couples to the conductor 25 on the tongue portion 23. The contact 28 and conductor are preferably coupled by using solder, but other means of connection known in the art can be used.

Figure 3:
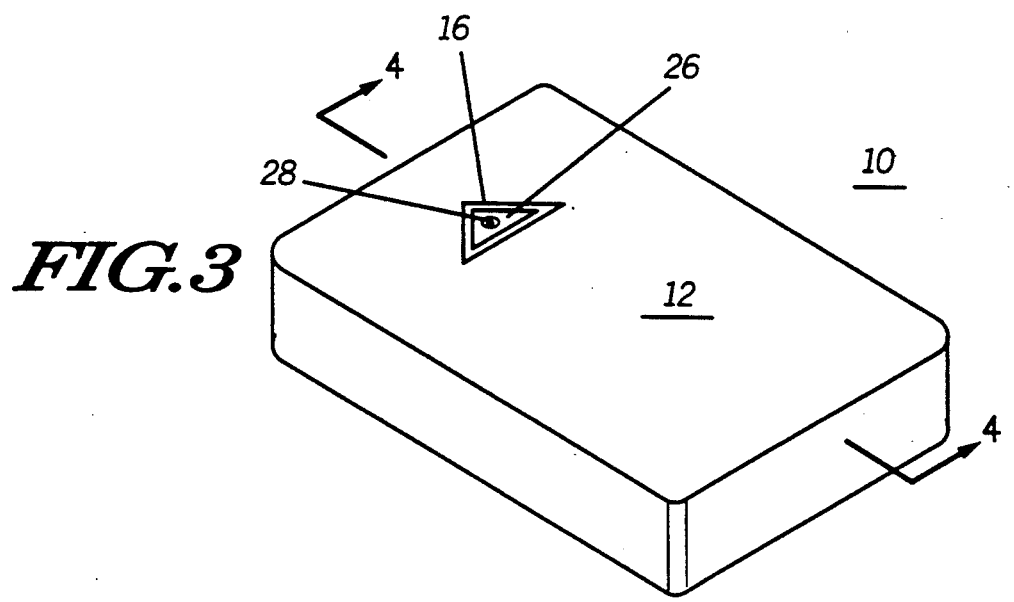
FIG. 3 is perspective view of the housing and the member through the housing in accordance with the present invention.

Referring to FIG. 3, there is shown the housing 12 with the member 26 being inserted through the aperture 14 as shown in FIG. 1. In assembly, the member 26, which could be the same size and shape as the aperture 14 (except if the shape of the aperture and member was a circle such as a manhole cover) is fed through the interior surface of the housing 12 and placed on the exterior surface of the housing 12. The insertion procedure is similar to that of buttoning a dress shirt button onto a shirt hole. Preferably, the counter sunk ridge 16 allows the self-aligned placement of the member. Alternatively, the member 26 could be placed anywhere on the exterior surface of the housing 12, leaving portions or all of the aperture exposed as desired.

Referring to FIG. 4, there is shown a side view of a battery including housing portion 11 and 12. Included within the housing portion 11 and 12 are a plurality of battery cells 33 which are coupled to the flex circuit substrate 22 and conductors as is known in the art, typically using steel tabs (not shown) welded or soldered (34) to the conductor on the flexible circuit and welded to the cell terminals. The conductor 25 on the flexible circuit is coupled to the contact 28 on the member 26 using solder 32. The housing portions 11 and 12 can be sealed and the member secured with an adhesive on the interior portion of the member 26, so that the aperture 14 is completely covered. Alternatively, the member 26 could be ultrasonically welded to the housing 12, thereby reducing the total number of parts and labor steps required to secure the contact. Optionally, the member 26 can be secured to the housing 12 and sealed by placing a label 30 over portions of the housing 12 and portions of the member. Preferably, the label has a hole 31 to allow the exposure of the contact 28. Using this assembly allows for the elimination of the variation in contact depths and most of the labor involved in securing parts within a battery pack. Furthermore, this allows for a reduction in parts used for backing and securing contacts.

What is claimed is:

1. An electrical contact assembly for insertion into an opening in a housing, comprising
    a flexible circuit having a tongue portion and a conductor on at least the tongue portion;
    a rigid member having an external contact, said external contact being coupled to the conductor;
    a housing having an exterior surface and an interior surface and an aperture, wherein the rigid member is inserted through the aperture through the interior surface and covers portions of the aperture and the exterior surface.

2. The electrical contact assembly of claim 1, wherein said aperture further includes a counter sunk ridge about the periphery of the aperture to allow the self-aligned placement of the rigid member.

3. The electrical contact assembly of claim 1, wherein the member is secured to the housing by using an adhesive.

4. The electrical contact assembly of claim 1, wherein the member is secured to the housing by placing a label over a portion of the member and over a portion of the housing.

5. A battery pack, comprising:
 a housing having an aperture;
 a flexible circuit within the housing having a tongue portion and at least a conductor on the tongue portion;
 a member having at least one contact, said member being coupled to the tongue and said contact being coupled to the conductor;
 a plurality of cells within the housing having at least one terminal coupled to the conductor of the flexible circuit;
 said aperture further includes a counter sunk ridge about the periphery of the aperture to all a self-aligned placement of the member coupled to the tongue.

6. A battery pack, comprising:
 a housing having an aperture;
 a flexible circuit with the housing having a tongue portion and at least a conductor on the tongue portion;
 a member having at least one contact, said member being coupled to the tongue and said contact being coupled to the conductor, the member is secured to the housing by using an adhesive;
 a plurality of cells within the housing having at least one terminal coupled to the conductor of the flexible circuit.

7. A battery pack, comprising:
 a housing having an aperture;
 a flexible circuit within the housing having a tongue portion and at least a conductor on the tongue portion;
 a member having at least one contact, said member being coupled to the tongue and said contact being coupled to the conductor, the member is secured to the housing by placing a label over a portion of the member and over a portion of the housing, allowing the contact on the member to be exposed;
 a plurality of cells within the housing having at least one terminal coupled to the conductor of the flexible circuit.

* * * * *